(12) United States Patent
Kim

(10) Patent No.: US 7,105,414 B2
(45) Date of Patent: Sep. 12, 2006

(54) METHOD OF MANUFACTURING MOS TRANSISTOR

(75) Inventor: Hak-Dong Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/023,843

(22) Filed: Dec. 27, 2004

(65) Prior Publication Data

US 2006/0141724 A1 Jun. 29, 2006

(30) Foreign Application Priority Data

Dec. 27, 2003 (KR) ................. 10-2003-0098374
Dec. 30, 2003 (KR) ................. 10-2003-0100925

(51) Int. Cl.
*H01L 21/336* (2006.01)
*H01L 21/425* (2006.01)

(52) U.S. Cl. ............... 438/306; 438/514; 438/522

(58) Field of Classification Search ......... 438/301, 438/306, 514, 520, 522
See application file for complete search history.

(56) References Cited

U.S. PATENT DOCUMENTS 6,380,036 B1* 4/2002 Oda et al. ............... 438/289

6,475,887 B1* 11/2002 Kawasaki et al. .......... 438/528
6,521,527 B1* 2/2003 Kuroi et al. ............... 438/652

FOREIGN PATENT DOCUMENTS

EP 0 806 796 * 11/1997
KR 0132441 Y1 9/1998

OTHER PUBLICATIONS

Abstract of Korean Patent Publication; Plasma Charge-up Removing Apparatus of a Plasma Enhanced Chemical Vapor Deposition System; Registration No. 20-0132441; Sep. 26, 1998.

* cited by examiner

Primary Examiner—Hsien-Ming Lee
(74) Attorney, Agent, or Firm—Andrew D. Fortney

(57) ABSTRACT

A method of manufacturing a MOS transistor capable of suppressing a short channel effect by suppressing boron (B) ion diffusion in the MOS transistor. The method includes steps of: forming an impurity diffusion suppressing layer in an active region of a semiconductor substrate; forming an impurity layer containing boron ions in a lower portion of the impurity diffusion suppressing layer; and thermally treating on the substrate, wherein the impurity diffusion suppressing layer suppresses diffusion of the boron ions during the thermal treatment step.

20 Claims, 5 Drawing Sheets

METHOD OF MANUFACTURING MOS TRANSISTOR

BACKGROUND OF THE INVENTION (a) Field of the Invention

The present invention relates to a method of manufacturing a semiconductor device, and more particularly, to a method of manufacturing a MOS transistor.

(b) Description of the Related Art

Recently, technologies for MOS devices have been rapidly developed, so that small-sized high-performance MOS devices can be obtained. In order to achieve the small-sized high-performance MOS devices, technologies relating to thicknesses of gate oxide layers, source/drain regions, and channel region must be improved.

As the MOS transistors are highly integrated, a short channel effect (SCE) occurs. In order to suppress the short channel effect, the thickness of the gate oxide layer needs to be small. In addition, the source/drain regions need to be formed with a shallow junction to reduce a charge sharing effect.

In addition, in order to suppress the short channel effect of the MOS transistor, a lightly doped drain region and a halo region may be provided in a vicinity of the channel region. Preferably, impurity ions implanted to adjust threshold voltages are distributed on or near a surface of the channel region.

On the other hand, boron (B) or BF ions are used to adjust the threshold voltage in n-channel MOS transistors and form the LDD region in p-channel MOS transistors.

However, B ions have a tendency to be widely diffused as subsequent processes such as thermal treatment are carried out. As a result, in the p-channel MOS transistor, B ions may be sufficiently diffused to reach an EOR (end of range) of the channel region, so that a parasitic capacitance between the gate and the drain may increase. On the other hand, in the n-channel MOS transistor, B ions may be sufficiently diffused into a lower portion of the substrate to reach a lower portion of the channel region, so that it is difficult to suppress the short channel effect.

SUMMARY OF THE INVENTION

In order to solve the aforementioned problems, an object of the present invention is to provide a method of manufacturing a MOS transistor capable of suppressing a short channel effect by preventing boron (B) ions from unnecessarily diffusing in the MOS transistor.

According to an aspect of the present invention, there is provided a method of manufacturing a MOS transistor, comprising steps of: forming an impurity diffusion suppressing layer in an active region of a semiconductor substrate; forming an impurity layer containing boron ions in a lower portion of the impurity diffusion suppressing layer; and performing a thermal treatment process on the substrate, wherein the impurity diffusion suppressing layer suppresses diffusion of the boron ions during the thermal treatment process.

In the above aspect of the present invention, the impurity diffusion suppressing layer may contain germanium or nitrogen ions.

According to another aspect of the present invention, there is provided method of manufacturing a MOS transistor, comprising steps of: forming a germanium implant layer in the surface of an active region defined by isolation structures in a semiconductor substrate by a first ion implanting process; forming an impurity layer containing boron ions in the active region of the substrate by a second ion implanting process to adjust a threshold voltage, the impurity layer being formed at a deeper level than the germanium implant layer; and heating the substrate.

In the latter aspect of the present invention, the first ion implanting process may be performed with an implanting energy of about 5 to 50 keV and a concentration of $1 \times 10^{14}$ to $5 \times 10^{14}$ ions/cm$^2$, and the second ion implanting process may be performed with an implanting energy of about 10 to 50 keV and a concentration of $1 \times 10^{13}$ to $1 \times 10^{14}$ ions/cm$^2$.

In addition, heating may comprise a rapid thermal annealing process at a temperature of about 800 to 1000° C. in an N$_2$ ambient for 10 to 30 seconds.

According to still another aspect of the present invention, there is provided a method of manufacturing a MOS transistor, comprising steps of: forming nitrogen implant layers in a surface of a semiconductor substrate at both sides of a gate over an active region defined by an isolation layer in the substrate by a first ion implanting process; and forming lightly doped drain regions containing boron ions in the substrate at both sides of the gate by using a second ion implanting process. A gate insulating layer may be between the gate and the active region of the substrate.

In the aspect of the present invention described in the preceding paragraph, the first ion implanting process may be performed with an implanting energy of about 10 to 50 keV and a concentration of $1 \times 10^{14}$ to $5 \times 10^{14}$ ions/cm$^2$, and the second ion implanting process may be performed with an implanting energy of about 5 to 50 keV and a concentration of $1 \times 10^{14}$ to $5 \times 10^{15}$ ions/cm$^2$. In addition, the process may further comprise heating by a rapid thermal annealing process at a temperature of about 600 to 800° C. in an N$_2$ ambient for 10 to 60 seconds.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Now, exemplary embodiments of the present invention will be described with reference to the attached drawings. However, the present invention can be embodied in various modifications and thus is not limited to the embodiments described below.

Firstly, a method of manufacturing an n-channel MOS transistor according to a first embodiment of the present invention will be described with reference to FIGS. 1A to 1C.

Figure 1A:
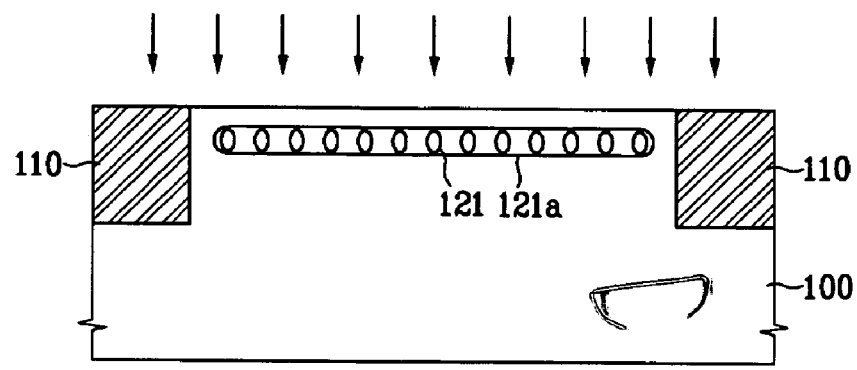
FIGS. 1A to 1C are cross sectional views for explaining a method of manufacturing an n-channel MOS transistor according to a first embodiment of the present invention.

Referring to FIG. 1A, an active region is defined by forming an isolation layer 110 (e.g., comprising a plurality of isolation structures) in a p-type semiconductor substrate 100. The p-type semiconductor substrate 100 is a silicon substrate. The isolation layer 110 may be formed by a shallow trench isolation (STI) process. In some cases, the isolation layer 110 may be formed by a LOCOS process. In addition, instead of the p-type semiconductor substrate 100, an n-type semiconductor substrate may be used. In this case, a p-type well region is formed on the n-type semiconductor substrate.

Next, a relatively shallow germanium (Ge) implant layer 121a is formed in or near the surface of the active region of the substrate 100 by first implanting Ge ions (121) into the substrate 100. The Ge implant layer 121a prevents and/or inhibits boron (B) ions of a subsequently-formed threshold voltage adjusting layer from diffusing into a lower portion of the substrate 100 during a thermal treatment process. Here, the first ion implanting process is typically performed with an implanting energy of about 5 to 50 keV and a concentration of $1 \times 10^{14}$ to $5 \times 10^{14}$ ions/cm$^2$. When the Ge ions are implanted in the active region of the substrate 100, oxygen atoms (not shown) may be collected or gettered in an EOR (end of range) portion of the Ge implant layer 121a.

Figure 1B:
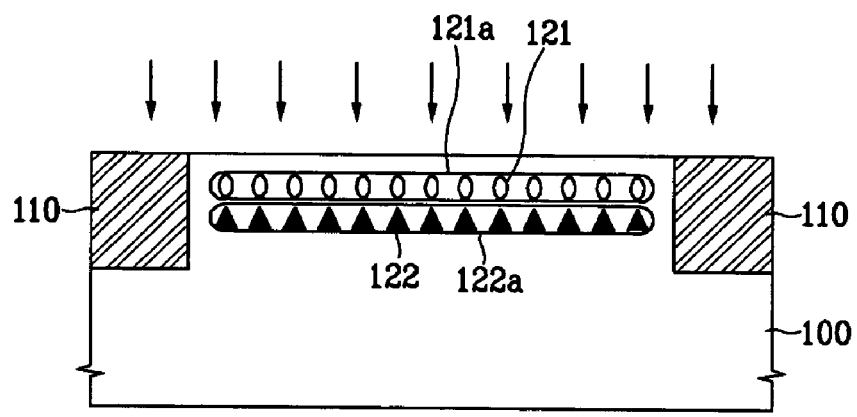

Referring to FIG. 1B, in order to adjust the threshold voltage of a subsequently formed transistor, a B implant layer 122a is formed in the active region of the substrate 100 by implanting B ions 122 as p-type impurities into the substrate 100 with a second ion implanting process. Here, the B implant layer 122a is formed at a deeper level than the Ge implant layer 121a. The second ion implanting process is typically performed with an implanting energy of about 10 to 50 keV and a concentration of $1 \times 10^{13}$ to $1 \times 10^{14}$ ions/cm$^2$.

Figure 1C:
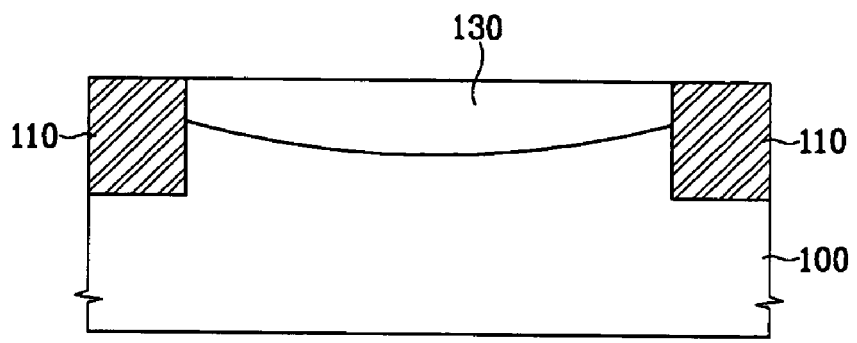

Referring to FIG. 1C, the threshold voltage adjusting layer 130 is formed in the surface of the active region of the substrate 100 by performing a thermal treatment process (e.g., heating or annealing). Here, the thermal treatment process may comprise an RTP or RTA (rapid thermal processing or rapid thermal anneal), typically performed at a temperature of about 800 to 1000° C. in an N$_2$ ambient for 10 to 30 seconds. During the thermal treatment process, the B ions 122 are diffused closer to the surface of the substrate 100, by the relatively shallow Ge implant layer and/or oxygen collected/gettered in the Ge implant layer 121a. As a result, the threshold voltage adjusting layer 130 has an impurity profile in which more impurities are distributed near the surface of the substrate 100. Consequently, the present invention effectively suppresses the short channel effect.

Figure 2:
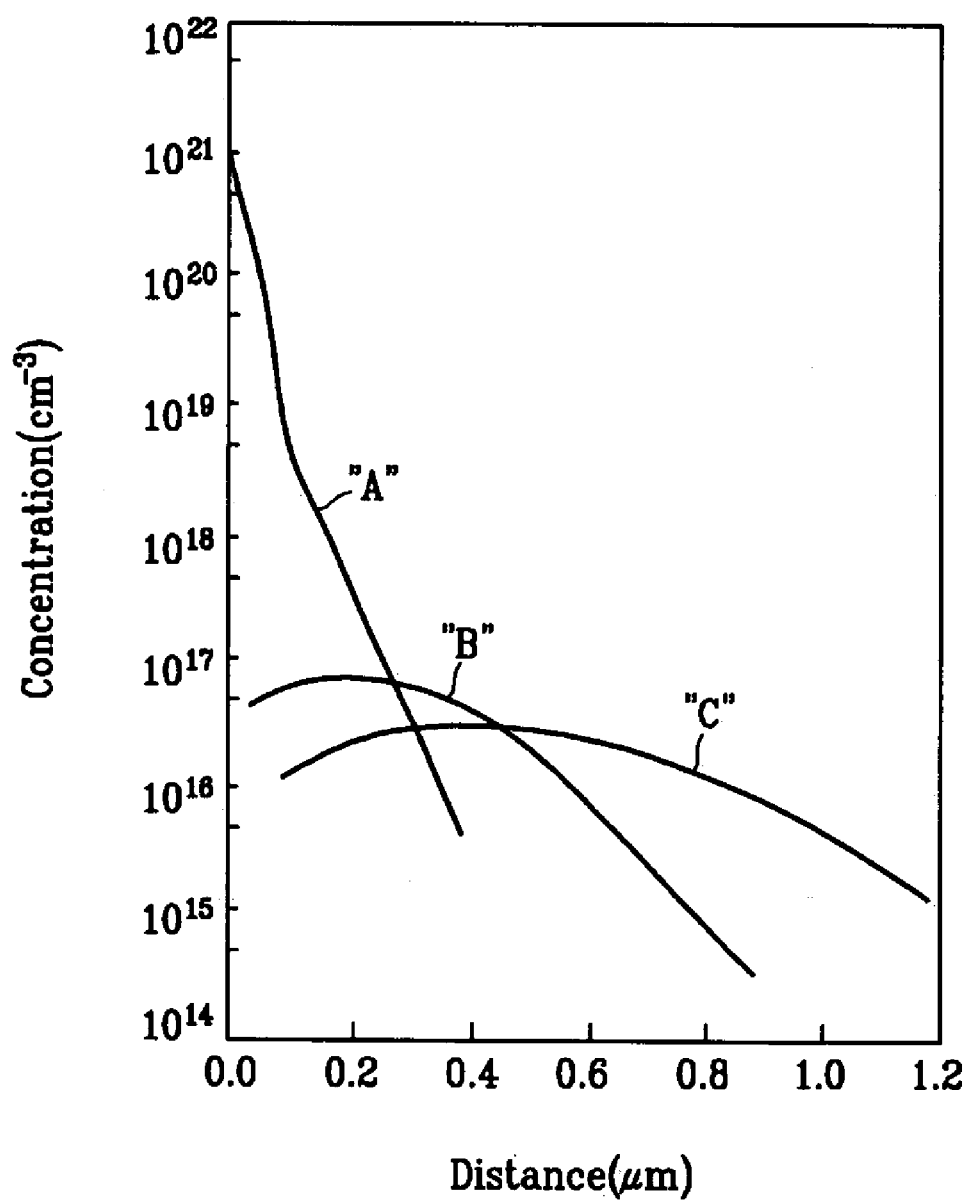
FIG. 2 is a graph showing a impurity concentration distribution of a threshold voltage adjusting layer in the n-channel MOS transistor according to the first embodiment of the present invention.

FIG. 2 is a graph showing an impurity concentration distribution of the threshold voltage adjusting layer 130 with respect to the vertical distance from the surface of the substrate 100. In this graph, the curve "A" represents a Ge concentration profile in the surface of the substrate 100; the curve "B" represents a B concentration profile in the surface of the substrate 100 implanted with the Ge ions according to the present invention; and the curve "C" represents a conventional B concentration profile in the surface of the substrate 100 not implanted with Ge ions. As shown in FIG. 2, it can be noted that, if the Ge ions are implanted in the surface of the substrate 100, a larger amount of B ions are distributed in the surface of the substrate 100 than without the Ge implant layer. Thus, in this aspect of the present invention, the boron ions for a threshold voltage adjustment layer may be implanted in the active region of the substrate such that the threshold voltage adjustment layer has a greater peak concentration depth than the germanium implant layer.

Next, although not shown in FIGS. 1A–1C, subsequent processes for forming a gate and gate oxide, LDD implant regions, halo implant regions, source/drain regions, and silicide layers are carried out.

Now, a method of manufacturing a p-channel MOS transistor according to a second embodiment of the present invention will be described with reference to FIGS. 3A to 3F.

Figure 3A:
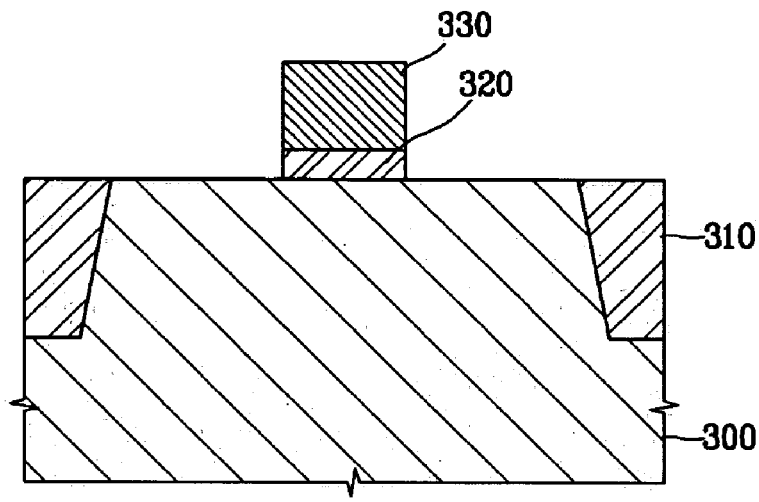
FIGS. 3A to 3F are cross sectional views for explaining a method of manufacturing an p-channel MOS transistor according to a second embodiment of the present invention.

Referring to FIG. 3A, an active region is defined by forming an isolation layer 310 (e.g., a plurality of isolation structures) in an n-type semiconductor substrate 300. Here, the n-type semiconductor substrate 300 may comprise a silicon substrate. The isolation layer 310 may be formed by an STI process. In some cases, the isolation layer 310 may be formed by a LOCOS process. In addition, instead of the n-type semiconductor substrate 300, a p-type semiconductor substrate may be used. In this case, an n-type well region is formed on the p-type semiconductor substrate. Next, a gate insulating layer 320 and a gate 330 are subsequently stacked and conventionally formed on the active region of the substrate 300. Here, the gate insulating layer 320 is an oxide layer formed by conventional thermal oxidation, having a thickness of 20 to 100 Å. The gate 330 comprises a polysilicon layer, typically having a thickness of 1500 to 3000 Å.

Figure 3B:
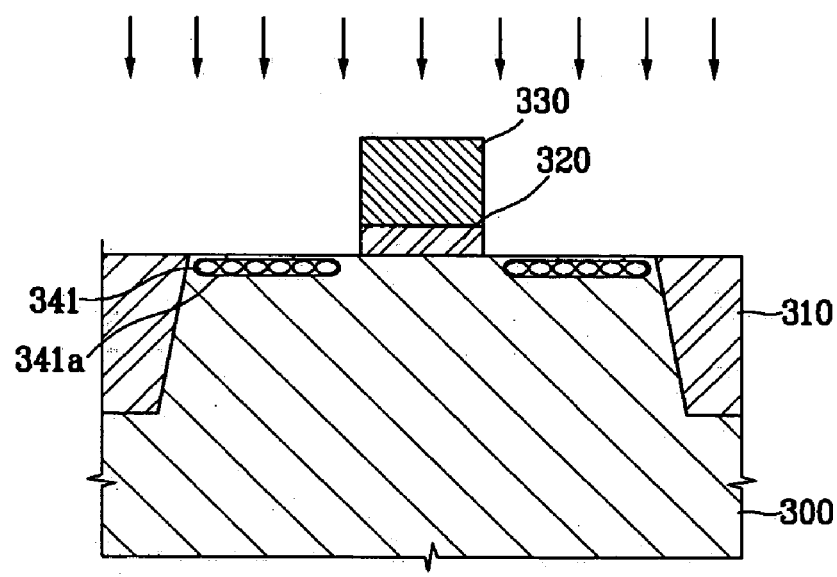

Referring to FIG. 3B, a nitrogen implant layer 341a is formed on a surface of the substrate 300 at both sides of the gate 330 by implanting nitrogen (N) ions into the substrate 300 in a first ion implanting process. The N ions 341 facilitate Si atoms of the substrate 300 to recombine with defects in the substrate 300 such as interstitial sites, so that diffusion of B ions of the subsequently-formed LDD region into the channel region during the thermal treatment process can be reduced or suppressed. The first ion implanting process is performed with an implanting energy of about 10 to 50 keV and a concentration of $1 \times 10^{14}$ to $5 \times 10^{14}$ ions/cm$^2$.

Figure 3C:
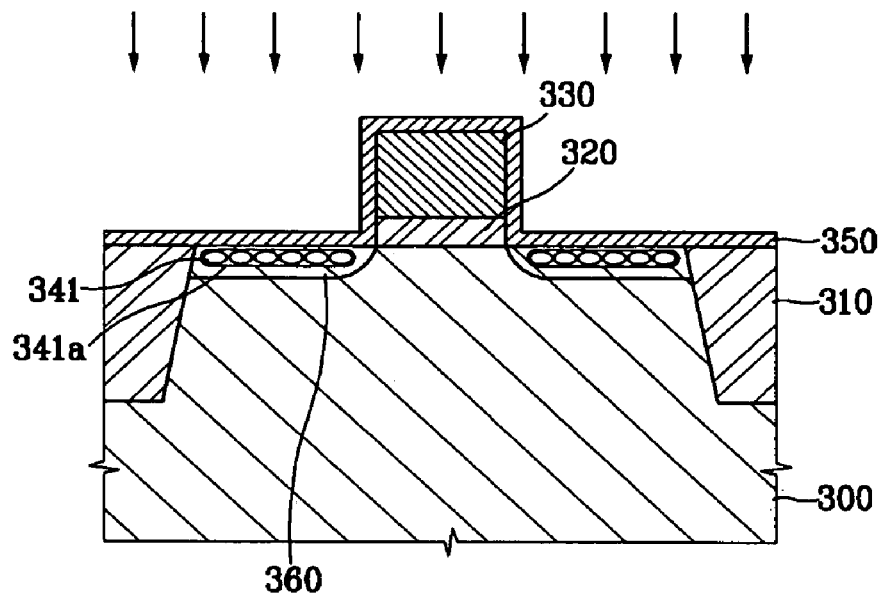

Referring to FIG. 3C, in order to reduce damage to the gate 330, gate insulating layer 320 and/or substrate 300, an oxide layer 350 may be formed on the entire surface of the substrate 300 by thermal oxidation or a deposition process (e.g., PE-CVD, HDP-CVD, etc.). Next, the LDD regions 360 are formed in the substrate 300 at both sides of the gate 330 by implanting B or BF2 ions as lightly doped p-type impurities into the substrate 300 with a second ion implanting process. The second ion implanting process is typically performed with an implanting energy of about 5 to 50 keV and a concentration of $1 \times 10^{14}$ to $5 \times 10^{15}$ ions/cm2.

Figure 3D:
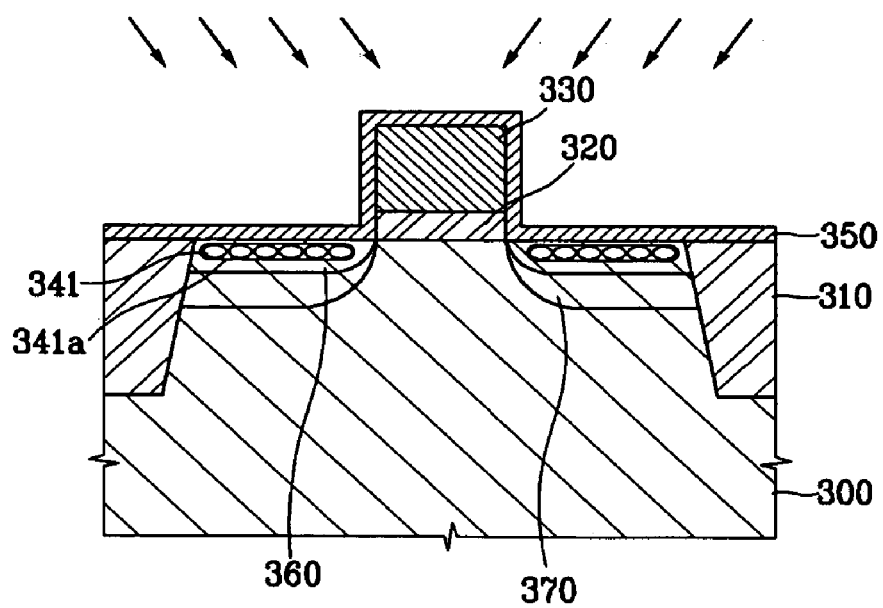

Referring to FIG. 3D, halo regions 370 are formed in a lower portion of the LDD region 360 by implanting As ions as n-type impurities into the substrate 300 in a tilted direction with a third ion implanting process. Here, the third ion implanting process is typically performed at a tilt angle of 10° to 40° with an implanting energy of about 10 to 60 keV and a concentration of $1 \times 10^{14}$ to $1 \times 10^{15}$ ions/cm$^2$.

Figure 3E:
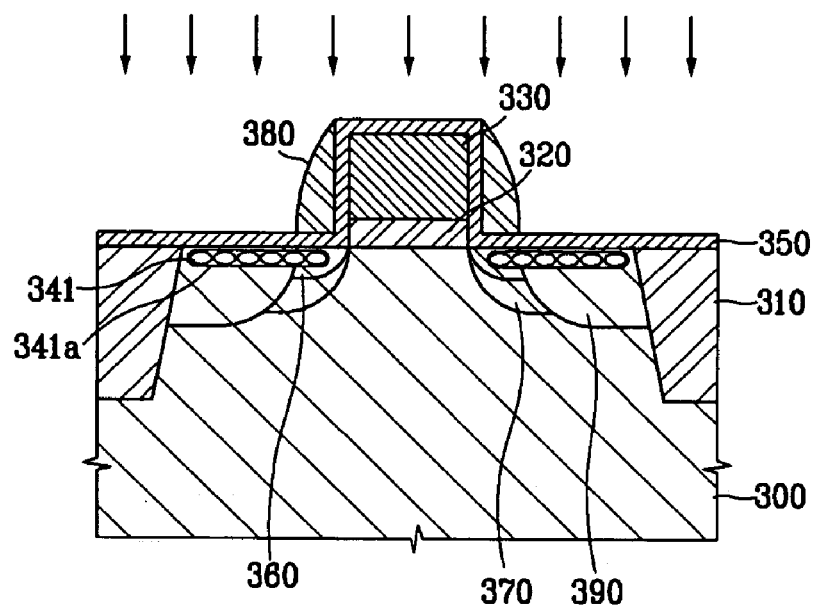

Referring to FIG. 3E, spacers 380 are formed on side walls of the gate 330 by using a general and/or conventional spacer forming process. Here, the spacers 380 comprise an insulating layer such as silicon nitride. Next, source/drain regions 390 are formed in the substrate 300 at both sides of the spacers 380 by implanting B or BF2 ions as highly doped p-type impurities into the substrate 300 with a fourth ion implanting process. The fourth ion implanting process is typically performed with an implanting energy of about 3 to 20 keV and a concentration of $1 \times 10^{15}$ to $5 \times 10^{15}$ ions/cm$^2$.

Next, the impurities implanted in the substrate 300 are activated by performing a thermal treatment process. Here, the thermal treatment process may comprise an RTP or RTA (rapid thermal processing or rapid thermal anneal) process, typically performed at a temperature of about 600 to 800° C. in an N$_2$ ambient for 10 to 60 seconds. The nitrogen implant layer 341a in the surface of the substrate 300 prevents or reduces diffusion of the B ions of the LDD regions 360 beyond an EOR (end of range) of the channel region. As a result, a parasitic capacitance between the gate 330 and the drain region 390 can be reduced or minimized.

Figure 3F:
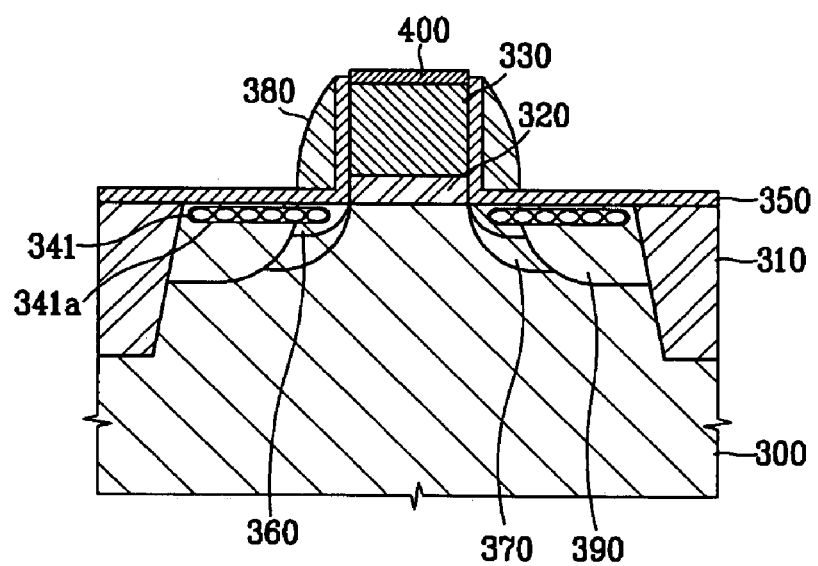

Referring to FIG. 3F, the oxide layer 350 is etched by using the spacer 380 as an etching barrier to expose the upper portions of the gate 330 and the source/drain regions 390. Next, a general and/or conventional silicide process is performed to form metal silicide layers 400 on the gate 330 and the source/drain regions 390.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of manufacturing a MOS transistor, comprising steps of:
    implanting germanium ions to form a germanium implant layer in a surface of an active region defined by an isolation layer in a substrate;
    implanting boron ions in the active region of the substrate to form a threshold voltage adjustment layer, the threshold voltage adjustment layer having a greater peak concentration depth than the germanium implant layer; and
    thermally treating the substrate.

2. The method of claim 1, wherein the germanium ion implanting step has an implant energy of about 5 to 50 keV and a concentration of $1\times10^{14}$ to $5\times10^{14}$ ions/cm$^2$.

3. The method of claim 2, wherein the boron ion implanting step has an implanting energy of about 10 to 50 keV and a concentration of $1\times10^{13}$ to $1\times10^{14}$ ions/cm$^2$.

4. The method of claim 1, wherein the thermal treating step comprises rapid thermal processing the substrate at a temperature of about 800 to 1000° C. in an N$_2$ ambient for 10 to 30 seconds.

5. The method of claim 1, further comprising providing p-type semiconductor substrate.

6. The method of claim 1, wherein the germanium ion implanting step has a concentration of $1\times10^{14}$ to $5\times10^{14}$ ions/cm$^2$.

7. The method of claim 1, wherein the boron ion implanting step has a concentration of $1\times10^{13}$ to $1\times10^{14}$ ions/cm$^2$.

8. The method of claim 1, wherein the germanium ion implanting step has an implanting energy of about 5 to 50 keV.

9. The method of claim 1, wherein the boron ion implanting step has an implanting energy of about 10 to 50 keV.

10. A method of manufacturing a MOS transistor, comprising steps of:
    implanting nitrogen ions in a semiconductor substrate having an active region defined by an isolation layer and a gate insulating layer and a gate thereon to form a nitrogen implant layer in the surface of the substrate on both sides of the gate;
    implanting boron ions in the substrate to form lightly doped drain regions on both sides of the gate:
    forming halo regions in a lower portion of the lightly doped drain regions by implanting third ions;
    forming spacers on sidewalls of the gate;
    implanting forth ions in the substrate on both sides of the spacers to form source/drain regions; and
    thermally treating the substrate.

11. The method of claim 10, wherein the nitrogen ion implanting step has an implanting energy of about 10 to 50 keV and a concentration of $1\times10^{14}$ to $5\times10^{14}$ ions/cm$^2$.

12. The method of claim 11, wherein the boron ion implanting step has an implanting energy of about 5 to 50 keV and a concentration of $1\times10^{14}$ to $5\times10^{15}$ ions/cm$^2$.

13. The method of claim 10, wherein the thermal treating step comprises rapid thermal processing the substrate at a temperature of about 600 to 800° C. in an N$_2$ ambient for 10 to 60 seconds.

14. The method of claim 10, further comprising providing a n-type semiconductor substrate.

15. The method of claim 10, wherein the third ions comprise As ions.

16. The method of claim 10, wherein the fourth ions comprise B or BF$_2$ ions.

17. The method of claim 10, further comprising implanting the third ions with an implanting energy of about 10 to 60 keV and a concentration of $1\times10^{14}$ to $1\times10^{15}$ ions/cm$^2$.

18. The method of claim 10, further comprising implanting the third ions at a tilt angle of 10° to 40°.

19. The method of claim 10, further comprising implanting the fourth ions with an implanting energy of about 3 to 20 keV and a concentration of $1\times10^{15}$ to $5\times10^{15}$ ions/cm$^2$.

20. The method of claim 10, further comprising forming metal silicide layers on the gate and the source/drain regions.

* * * * *